United States Patent
Avila et al.

(10) Patent No.: US 9,229,856 B2
(45) Date of Patent: *Jan. 5, 2016

(54) OPTIMIZED CONFIGURABLE NAND PARAMETERS

(71) Applicant: SanDisk Technologies Inc., Plano, TX (US)

(72) Inventors: Chris Avila, Saratoga, CA (US); Yingda Dong, San Jose, CA (US); Man Mui, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/452,749

(22) Filed: Aug. 6, 2014

(65) Prior Publication Data

US 2014/0351496 A1 Nov. 27, 2014

Related U.S. Application Data

(63) Continuation of application No. 13/791,200, filed on Mar. 8, 2013, now Pat. No. 8,830,717.

(60) Provisional application No. 61/731,198, filed on Nov. 29, 2012.

(51) Int. Cl.
| | |
|---|---|
| *G11C 11/34* | (2006.01) |
| *G06F 12/02* | (2006.01) |
| *G11C 11/412* | (2006.01) |
| *G11C 11/56* | (2006.01) |
| *G11C 16/06* | (2006.01) |
| *G11C 29/02* | (2006.01) |
| *G11C 5/06* | (2006.01) |

(Continued)

(52) U.S. Cl.
CPC .............. *G06F 12/0246* (2013.01); *G11C 5/06* (2013.01); *G11C 7/24* (2013.01); *G11C 11/412* (2013.01); *G11C 11/5621* (2013.01); *G11C 16/06* (2013.01); *G11C 29/021* (2013.01); *G11C 29/028* (2013.01); *G06F 2212/7205* (2013.01); *G11C 8/10* (2013.01); *G11C 11/5628* (2013.01); *G11C 11/5642* (2013.01); *G11C 29/50004* (2013.01); *H01L 45/122* (2013.01)

(58) Field of Classification Search
CPC .............. H01L 45/122; H01L 27/1052; H01L 25/0657; G03F 7/70433
USPC .................................. 365/185.11, 63, 185.02
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Fernando Hidalgo
(74) *Attorney, Agent, or Firm* — Davis Wright Tremaine LLP

(57) ABSTRACT

Configurable parameters may be used to access NAND flash memory according to schemes that optimize such parameters according to predicted characteristics of memory cells, for example, as a function of certain memory cell device geometry, which may be predicted based on the location of a particular device within a memory array.

16 Claims, 12 Drawing Sheets

(51) Int. Cl.
  *G11C 7/24* (2006.01)
  *H01L 45/00* (2006.01)
  *G11C 29/50* (2006.01)
  *G11C 8/10* (2006.01)

(56) References Cited

U.S. PATENT DOCUMENTS

| | | | |
|---|---|---|---|
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 8,569,809 B2 | 10/2013 | Thomas et al. | |
| 8,830,717 B2 * | 9/2014 | Avila et al. | 365/63 |
| 2003/0195714 A1 | 10/2003 | Jeddeloh | |
| 2009/0268523 A1 | 10/2009 | Maejima | |
| 2010/0023800 A1 | 1/2010 | Harari | |
| 2010/0097858 A1 | 4/2010 | Tokiwa et al. | |
| 2010/0271891 A1 | 10/2010 | Dell et al. | |
| 2011/0096601 A1 | 4/2011 | Gavens et al. | |
| 2012/0057405 A1 | 3/2012 | Ogiwara et al. | |
| 2012/0069667 A1 | 3/2012 | Shirakawa | |
| 2012/0176836 A1 | 7/2012 | Iguchi et al. | |
| 2012/0218836 A1 | 8/2012 | Ozawa | |
| 2012/0220088 A1 | 8/2012 | Alsmeier | |
| 2013/0322174 A1 | 12/2013 | Li et al. | |

OTHER PUBLICATIONS

Technical Search Report, Dec. 12, 2012, 8 pages.

Notice of Allowance for U.S. Appl. No. 13/792,200 mailed May 9, 2014, 11 pages.

Notification of Transmittal of the International Search Report and the Written Opinion of the International Searching Authority, or the Declaration for Int'l Appl. No. PCT/US2013/071505 mailed Mar. 14, 2014, 11 pages.

* cited by examiner

Programming into four states represented by a 2-bit code

OPTIMIZED CONFIGURABLE NAND PARAMETERS

CROSS-REFERENCE FOR RELATED APPLICATION

This application is a continuation of U.S. application Ser. No. 13/791,200 filed Mar. 8, 2013, which claims the benefit of U.S. Provisional Patent Application No. 61/731,198, filed on Nov. 29, 2012, which applications are hereby incorporated by reference in their entirety.

BACKGROUND

This application relates to the operation of re-programmable non-volatile memory systems such as semiconductor flash memory which record data using charge stored in charge storage elements of memory cells.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

Examples of the present invention relate to configurable parameters used to access memory arrays and to schemes for optimizing such parameters according to predicted characteristics of memory cells, for example, as a function of certain memory cell device geometry, which may be predicted based on the location of a particular device within a memory array. In 3-dimensional memory arrays, such as 3-D NAND, cell geometry may vary in a predictable manner according to distance from the substrate. Parameters may be configured to compensate for such variation.

An example of a method of operating a charge-storage memory cell array includes: identifying a pattern of variation of at least one memory cell dimension within the charge-storage memory cell array; determining a first set of parameters to use in accessing a first plurality of memory cells based on the at least one memory cell dimension of the first plurality of memory cells; determining a second set of parameters to use in accessing a second plurality of memory cells based on the at least one memory cell dimension of the second plurality of memory cells, the second set of parameters including at least one parameter that is different from the first set of parameters; subsequently accessing the first plurality of memory cells using the first set of parameters; and accessing the second plurality of memory cells using the second set of parameters.

The at least one memory cell dimension may be a diameter of a cylindrical memory hole. The charge-storage memory cell array may be a three-dimensional memory array, the first plurality of memory cells may be located in a lower portion of the three-dimensional memory array, the second plurality of memory cells may be located in an upper portion of the three-dimensional memory array, and the identified pattern of variation may indicate that the diameter of the cylindrical memory hole is greater in the second plurality of memory cells than in the first plurality of memory cells. The at least one parameter that is different may be a voltage that is applied to program memory cells. The at least one parameter that is different may be a number of voltage pulses used to program memory cells. The at least one parameter that is different may be a read voltage that is used to read memory cells. The at least one parameter may be an erase voltage that is used to erase memory cells. A write-erase cycle count may be maintained for blocks of the charge-storage memory array and the first and second sets of parameters may be updated according to the write erase cycle counts. The first set of parameters may be updated according to a first update scheme and the second set of parameters may be updated according to a second update scheme that is different from the first update scheme.

An example of a charge-storage memory cell array includes: an array of memory cells, each memory cell having a memory cell dimension, the memory cell dimension having a pattern of variation across the array of memory cells; and memory access circuits that access memory cells of the array of memory cells according to access parameters, the memory access circuits having a first set of parameters for accessing a first plurality of memory cells and a second set of parameters for accessing a second plurality of memory cells, the second set of parameters including at least one parameter that is different from the first set of parameters, the first plurality of memory cells and the second plurality of memory cells defined according to the pattern of variation.

The charge-storage memory cell array may be a three-dimensional memory array. The charge-storage memory cell array may be a three-dimensional NAND memory array which includes a plurality of NAND strings that extend vertically in a direction that is perpendicular to a substrate surface. The pattern of variation across the array of memory cells may be a pattern of variation of the memory cell dimension according to vertical distance from the substrate surface. The memory cell dimension may be a diameter of an opening that extends vertically through word lines with a channel extending vertically through the opening. A write-erase cycle count circuit may maintain write-erase cycle counts for blocks in the charge-storage memory cell array and update access parameters according to write-erase cycle counts. The write-erase cycle count circuit may have a first update scheme for updating the first set of parameters and a second update scheme for updating the second set of parameters.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
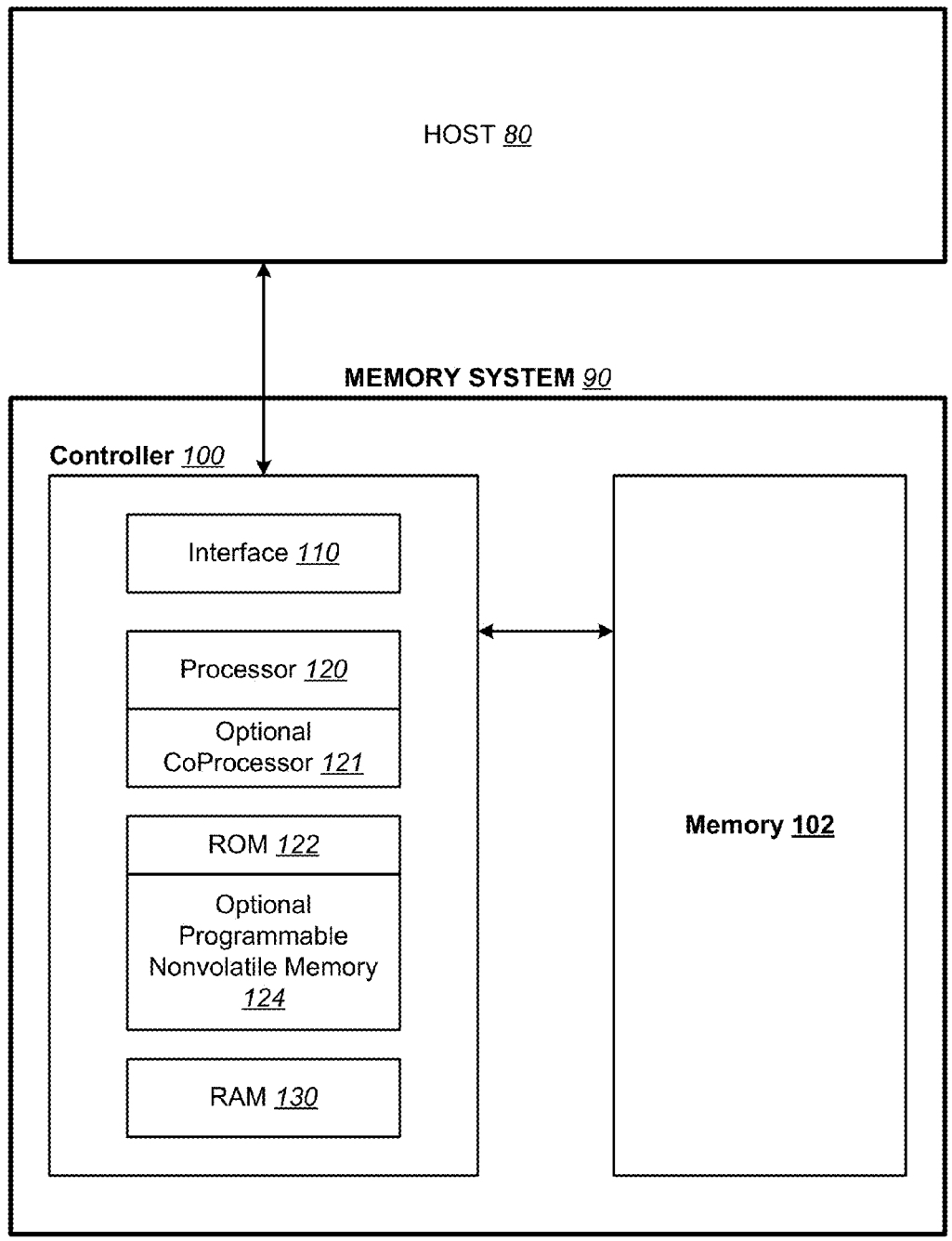
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. A controller is typically formed as an ASIC (application specific integrated circuit) and the components included in such an ASIC generally depend on the particular application.

Physical Memory Structure

Figure 2:
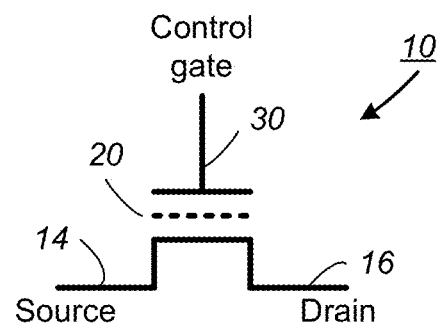
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
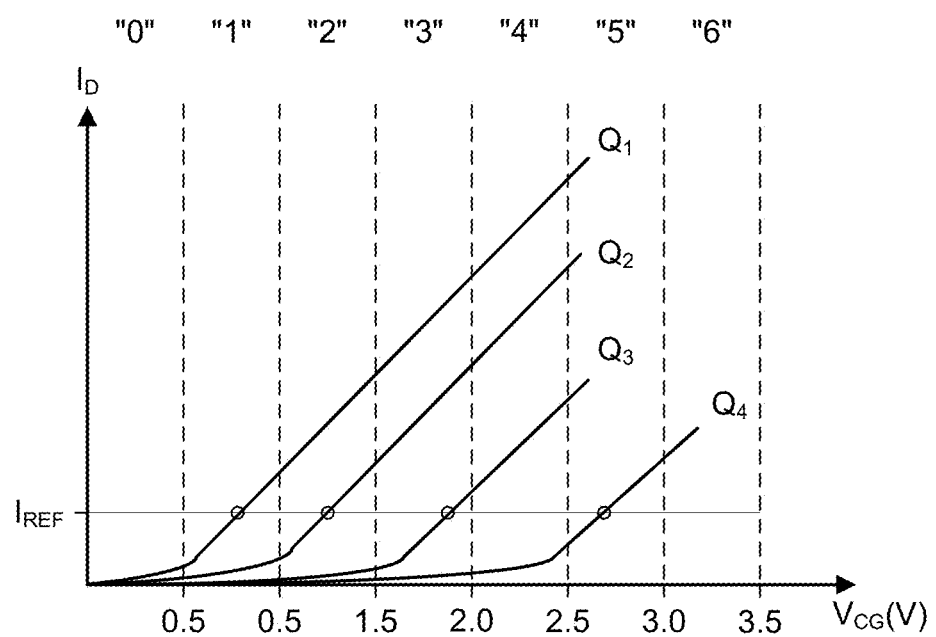
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four charge levels that can be programmed on a floating gate of a memory cell, respectively corresponding to four of eight possible memory states. As an example, the threshold voltage window of a population of cells may range from 0.5V to 3.5V. Seven programmed memory states "0", "1", "2", "3", "4", "5", "6", respectively, and one erased state (not shown), may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
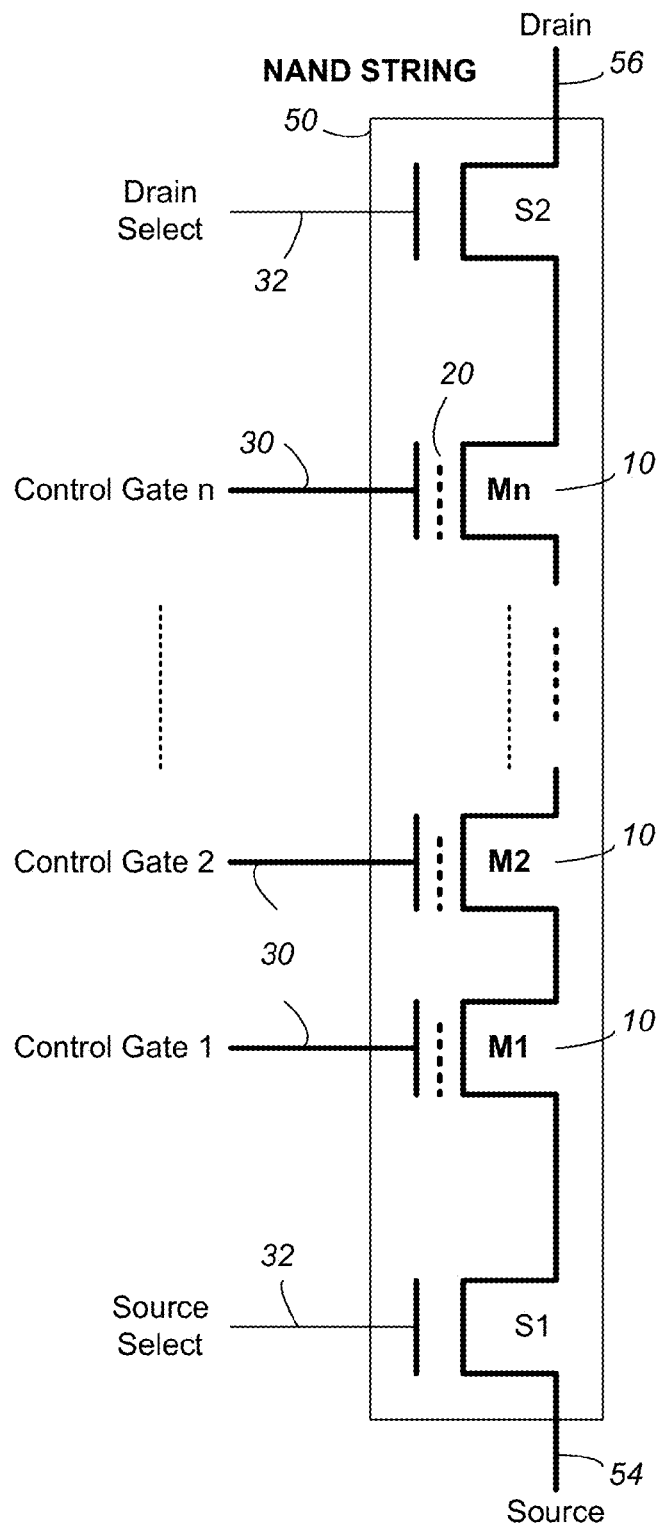
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
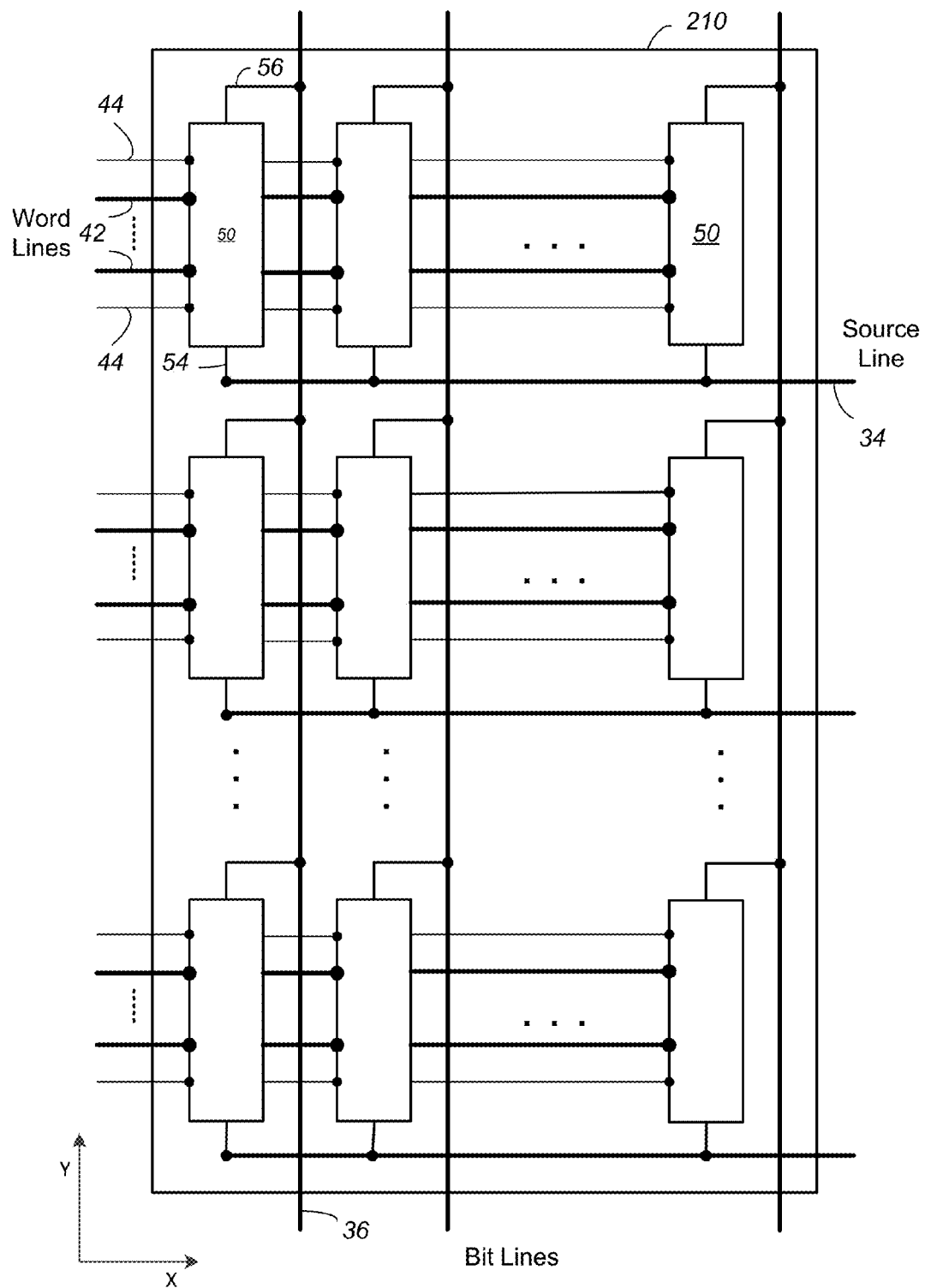
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
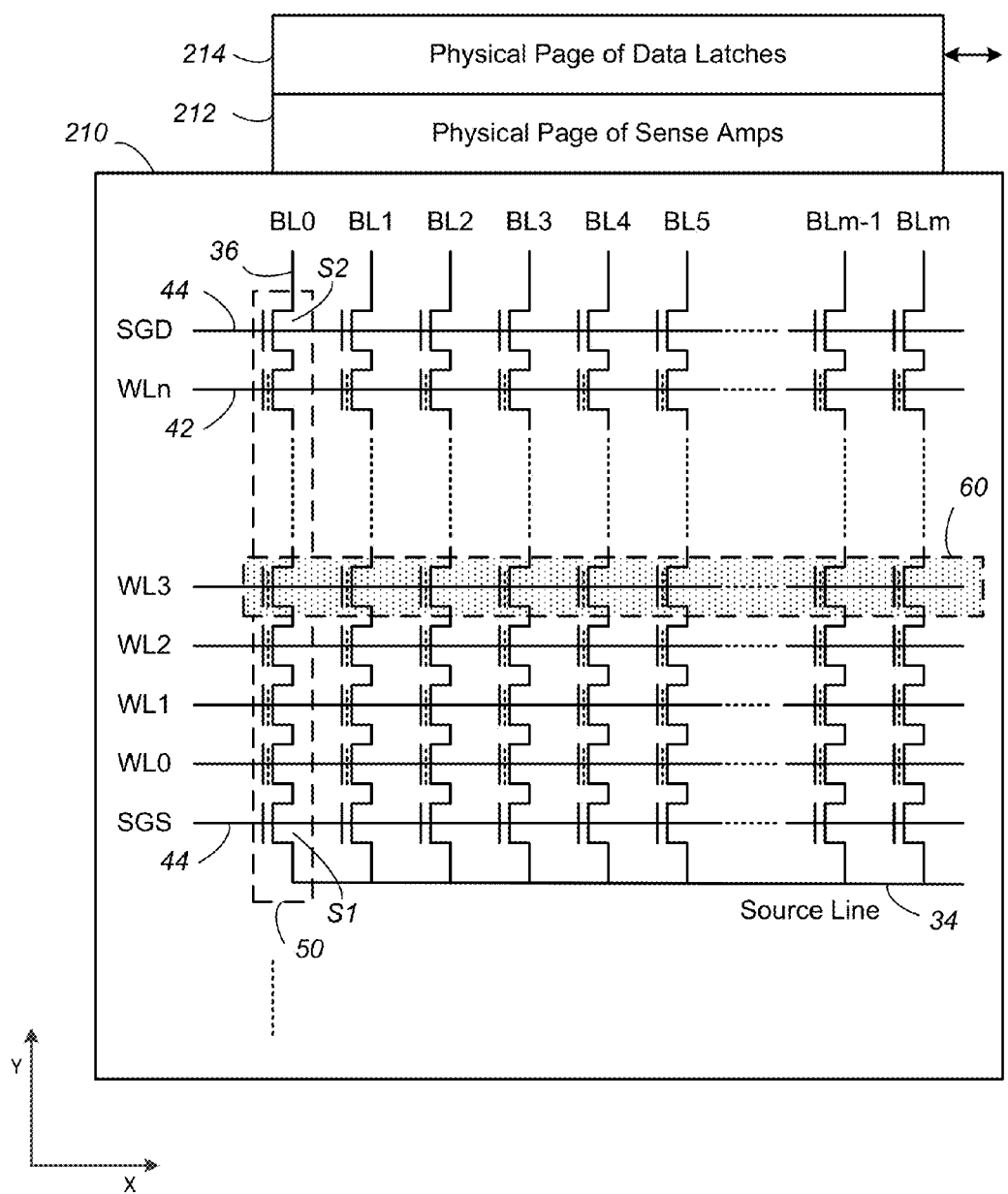
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

All-Bit, Full-Sequence MLC Programming

Figure 6:
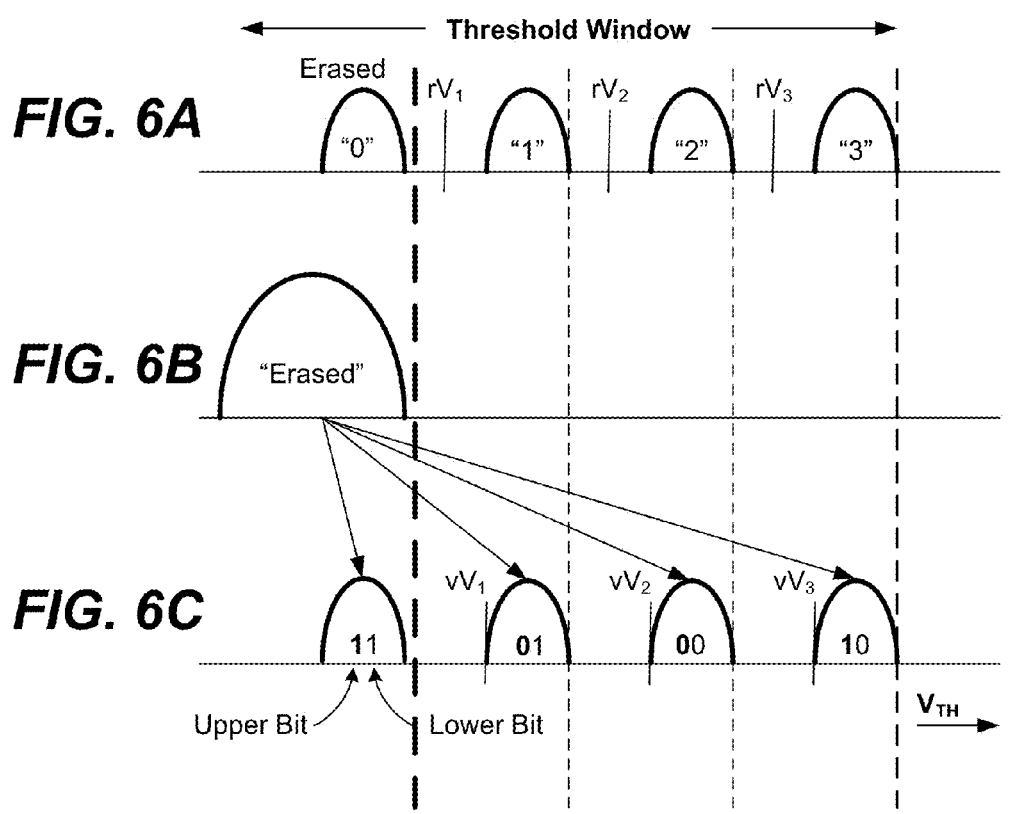
FIGS. 6A-6C illustrate an example of programming a population of 4-state memory cells.

FIG. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "1", "2" and "3" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10'. The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Overprogramming

One problem that may occur in either SLC or MLC memory is the problem of overprogramming of cells. When a cell is overprogrammed, too much charge is added to its charge storage element (e.g. floating gate) so that the cell is not within the expected distribution for the memory state to which it is being programmed.

Figure 7:
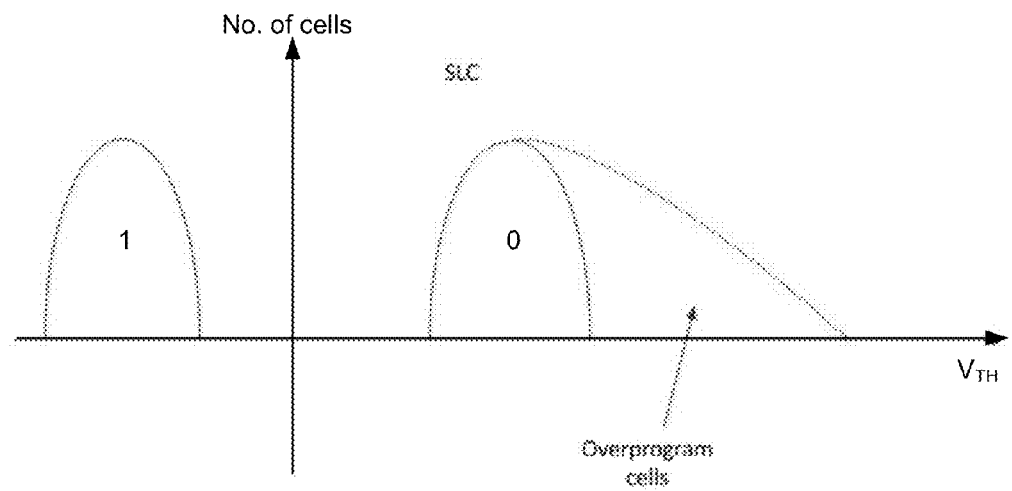
FIG. 7 illustrates an example of overprogramming in SLC memory.

FIG. 7 shows a first example of overprogramming. This example shows an SLC memory although the same phenomenon may occur in MLC memory cells. The programmed ("0") state shows a distribution (dashed line) that extends beyond the ideal distribution (shown by solid line). Thus, there are many cells that have a threshold voltage that is higher than the threshold voltage range that is assigned to the 0 state. One problem with such cells is that their high threshold voltage means that they can only be turned on (channel made conductive) by applying a higher control gate voltage. A voltage that is sufficient to turn on a cell that is within the assigned threshold voltage range may not be sufficient to turn on a cell that is overprogrammed as shown. In general a pass voltage, Vpass, used to turn on unselected cells in a NAND string when reading or programming a selected cell, is sufficient to turn on all cells within the assigned threshold voltage range. However, Vpass may not be sufficient to turn on an overprogrammed cell. Thus, an overprogrammed cell in a NAND string may remain nonconductive when Vpass is applied, causing other cells in the string to be read as being in the programmed "0" state even if they are in the "1" state. Significant numbers of overprogrammed cells may make an array, or a portion of an array, unusable. MLC cells programmed to the highest threshold voltage range, which are overprogrammed, may also have increased threshold voltages so that Vpass is not sufficient to turn them on.

Figure 8:
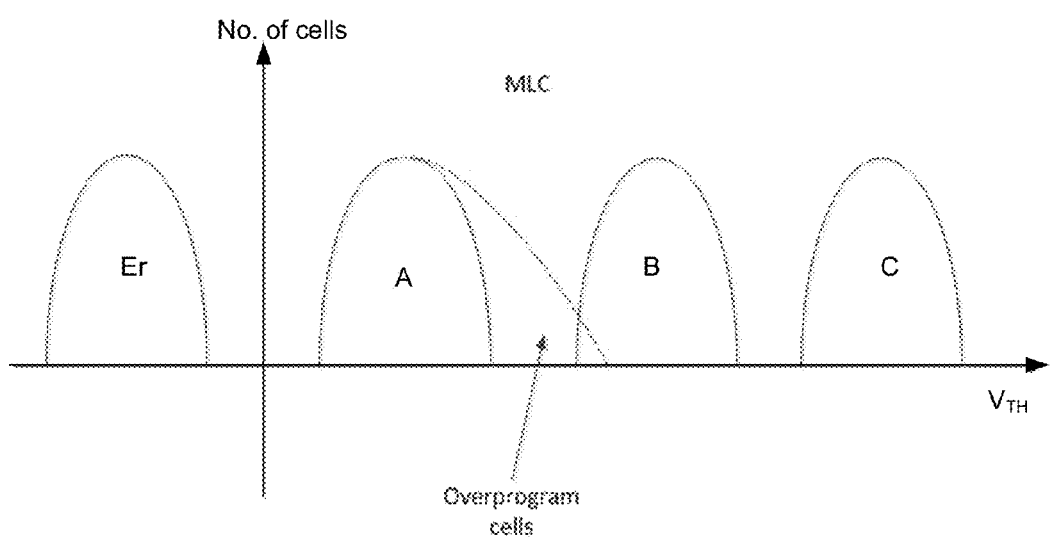
FIG. 8 illustrates an example of overprogramming in MLC memory.

FIG. 8 shows another example of overprogramming. This example shows an MLC memory. Memory states are marked as Erased "Er", "A," "B," and "C." It can be seen that the distribution of cells for state A as shown by the dashed line is different to the ideal distribution shown by the solid line. Thus, there are many cells that are overprogrammed so that they have a threshold voltage that is higher than the threshold voltage range assigned to state A. Some of these cells are sufficiently overprogrammed that their threshold voltages are in the threshold voltage range assigned to state B. Such cells will be read as being in state B and thus will provide incorrect data. Some of the cells of this distribution that are between the ranges assigned to A and B will also be read as being in state B. The number of such cells depends on the particular discrimination voltage used. While not shown in FIG. 8, similar overprogramming may also occur between state B and state C. Where more than four memory states are used, such overprogramming may occur between any two programmed (non-erased) states.

In many memories, overprogramming becomes worse as the memory array becomes worn (i.e. as the number of write-erase cycles increases). Repeated writing and erasing can produce physical changes in the memory cell that make overprogramming increasingly likely for a given cell.

Overprogramming may be related to the geometry of a particular memory device. While memory cells may all have the same nominal dimensions, real memory cells have some distribution of dimensions. Cells with dimensions that deviate from the nominal dimensions may have device characteristics that deviate from nominal device characteristics (for example having significantly faster programming times causing them to become overprogrammed). In particular, certain 3-D memory arrays have been found to have high programming speeds (and resulting overprogramming) as a result of particular dimensions.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending up from the wafer surface. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088.

Figure 9A:
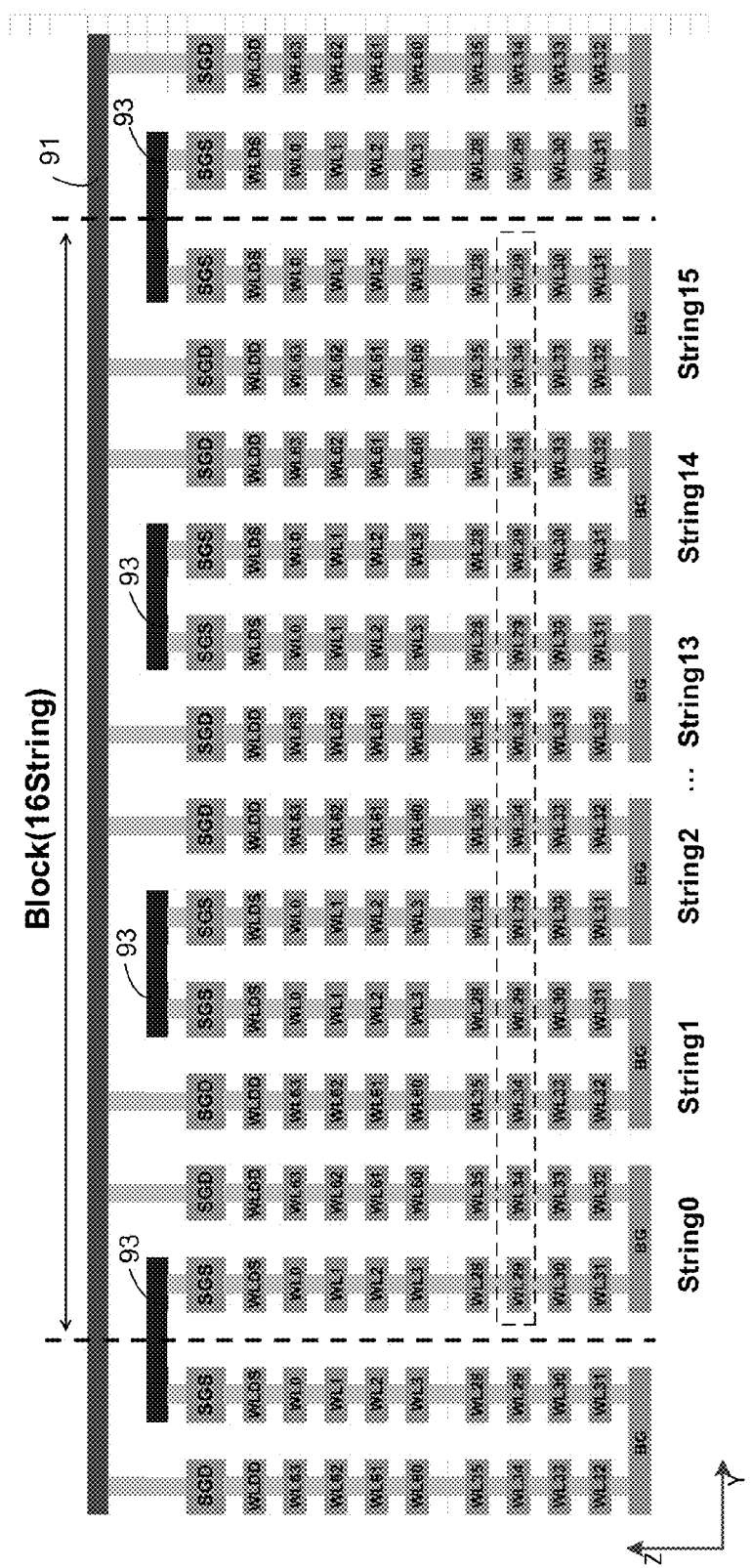
FIGS. 9A-9B show an example of a 3-D NAND memory array.

FIG. 9A shows a physical implementation of a 3-D NAND array. The bit line 91 extends as a continuous conductor (e.g. metal line) in the y-direction with vertical connections formed between the bit line and drains of strings (only strings 0-2 and 13-15 are shown—it will be understood that strings 3-12 are also present). Below the bit line, common source lines extend perpendicular to the cross section shown (i.e. extend in the x-direction) and connect sources of neighboring strings. Source select lines extend in the x-direction and form source select gates (SGS) where they intersect vertical columns. Drain select lines extend in the x-direction and form drain select gates (SGD) where they intersect vertical columns. Word lines WL0-WL63 extend in the x-direction and form control gates of memory cells where they intersect vertical columns. In one example, word lines are formed from conductive layers separated by dielectric layers, with channels of memory cells being formed in vertical holes ("memory holes") that extend through the conductive layers and dielectric layers.

The structure of the 3-D memory array of FIG. 9A is comprised of multiple layers, with each layer having the same replicated pattern (e.g. layer in dashed lines containing WL34 and WL29 is replicated at each level). Taking word line 34 as a typical word line, it can be seen that word line 34 alternates with word line 29 along the y-direction. While word lines of each string may be separately controlled in some memory systems, combining word lines saves space for driver circuits. In the present example, all word lines of the same number within a block are formed from a single portion of conductive material and remain as an electrically continuous unit. For example, all word lines marked WL34 are formed of a single electrically-conductive portion of material, and all word lines marked WL29 are formed of another electrically-conductive portion of material (which may be formed from the same layer).

Figure 9B:
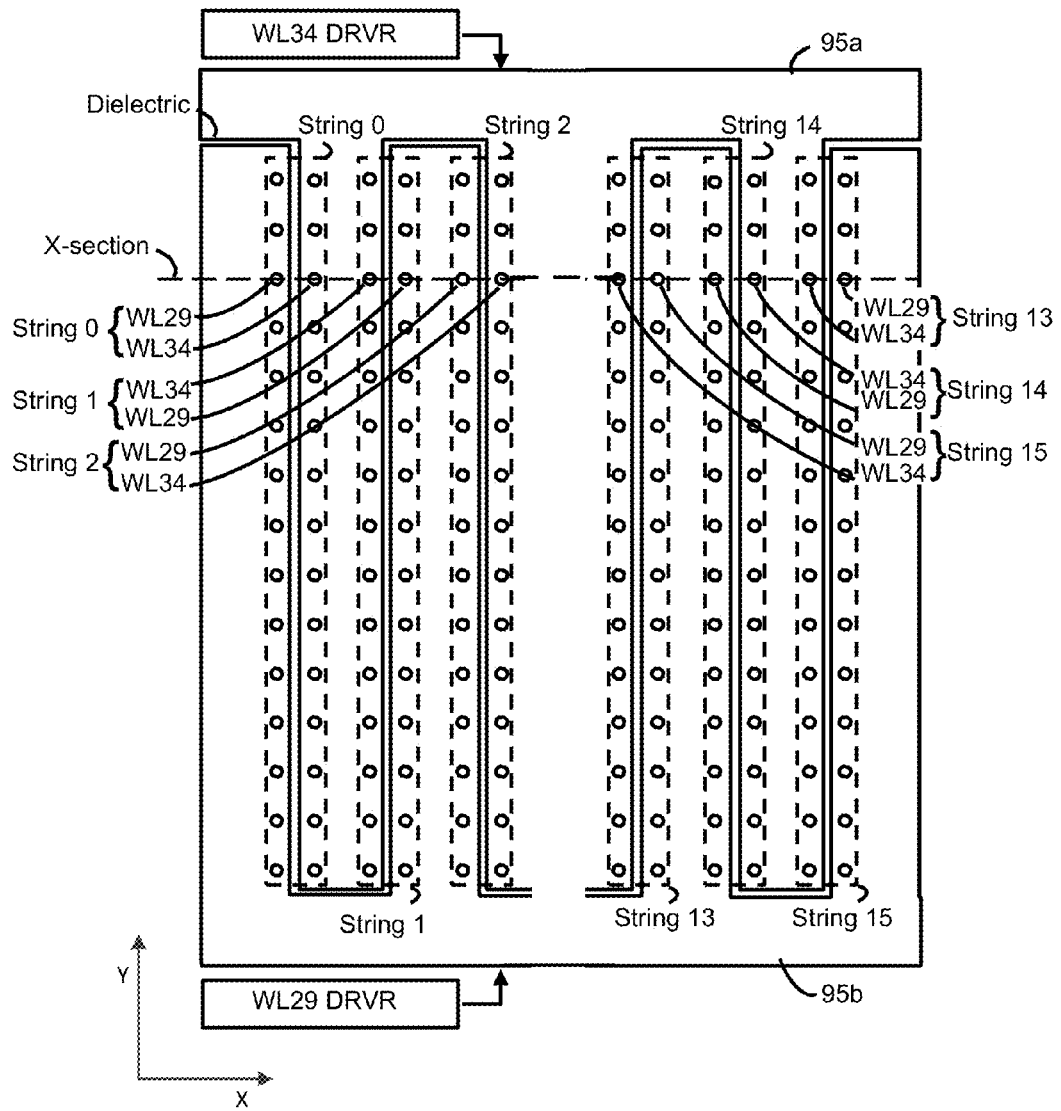

FIG. 9B shows a top-down view of the structure of word lines 34 and 29 with the horizontal dashed line showing the location of the cross section of FIG. 9A. It can be seen that a portion of conductive material 95a extends along the top in this view with extensions extending down (negative y-direction). These extensions form pairs of word lines shown in FIG. 9A (WL34) with memory cells formed where memory holes containing channels pass through the word lines. A driver circuit "WL34 DRVR" is connected to portion of conductive material 95a so that a controllable voltage can be applied to it and thus to control gates of all memory cells connected to any WL34 in this block. A similar portion of conductive material 95b extends along the bottom in this view with extensions extending up (positive y-direction). These extensions form pairs of word lines shown in FIG. 9A (WL29) with memory cells formed where memory holes pass through the word lines. A driver circuit "WL29 DRVR" is connected to portion of material 95b so that a controllable voltage can be applied to it and thus to control gates of all memory cells connected to any word line 29 in this block. The two portions of material 95a, 95b, may be formed by depositing a single layer of conductive material and patterning it into the portions shown (and similar portions for other blocks). A dielectric material may be used to fill the gap between portions. For example, a Shallow Trench Isolation (STI) process may be used to physically separate, and electrically isolate, the two portions. Dielectric layers above and below these portions (in the z-direction) insulate these portions from other similar layers. This pattern may be replicated for each pair of word lines in the block so that for 64 word lines, there are 32 layers similar to that shown in FIG. 9B, with dielectric layers in between.

Device Characteristics and Location

Figure 10:
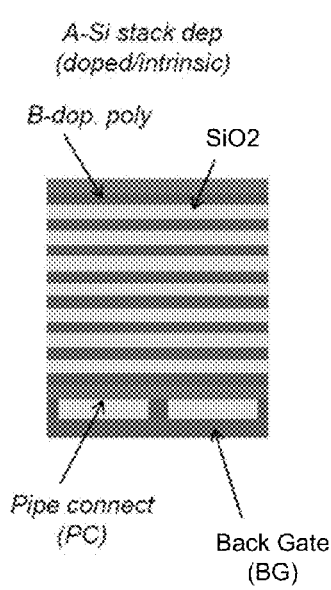
FIG. 10 shows an example of a 3-D NAND memory at an intermediate stage of fabrication.

FIGS. 10-13 show formation of a 3-D memory array of the type previously shown. FIG. 10 shows a substrate with a stack of layers on an upper surface. The substrate contains back gate structures which are later removed when forming the back gate. The stack of layers consists of alternating layers of Boron-doped (electrically conductive) polysilicon ("poly") and insulating dielectric (e.g. SiO2).

Figure 11:
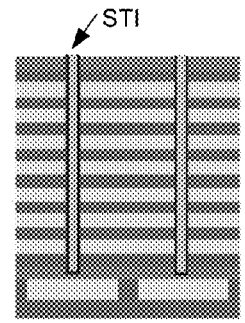
FIG. 11 shows the structure of FIG. 10 at a later stage of fabrication.

FIG. 11 shows formation of Shallow Trench Isolation (STI) trenches with dielectric filling to provide isolation between the two sides of a string. This dielectric separates the portions of conductive material that make up the word lines of a given layer (e.g. separating WL34 and WL29 above).

Figure 12:
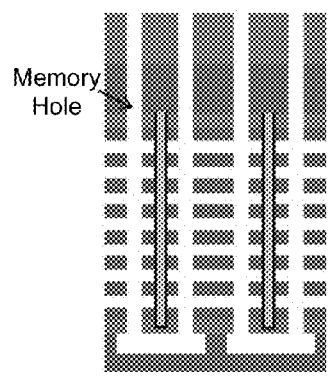
FIG. 12 shows the structure of FIG. 11 after formation of memory holes.

FIG. 12 shows additional layers including an etch mask layer with openings that are used to etch cylindrical memory holes as shown. In addition to etching the memory holes, a selective etch is used to remove insulating dielectric while leaving doped polysilicon throughout the stack. Back gate structures are also removed by selective etching. The remaining doped polysilicon portions become word lines.

Figure 13:
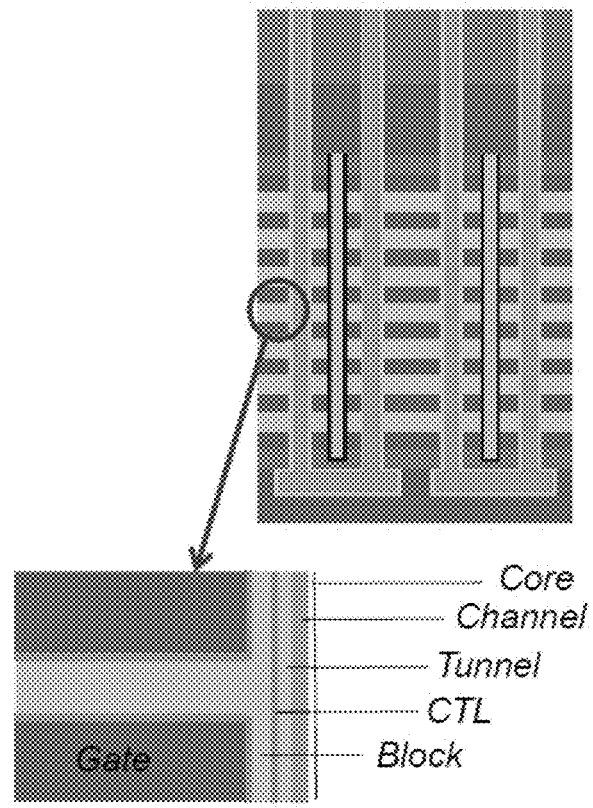
FIG. 13 shows a detailed view of memory elements in a memory hole of a 3-D NAND Memory.

FIG. 13 shows the structure after deposition of a stack of layers in the memory holes to form memory cells. It can be seen that a blocking dielectric "Block" is deposited on the doped polysilicon to provide electrical isolation. A Charge Trapping Layer (CTL) is deposited on the blocking dielectric. The CTL forms charge storage elements where the CTL is in close proximity to polysilicon word line. A tunnel dielectric is deposited to provide electrical isolation and to allow charge to tunnel into the CTL under certain conditions. A channel material is deposited to form the channel of the memory cells along the string. A core material is deposited that forms the core of the column that is located in the memory hole.

While FIGS. 10-13 show an idealized profile for memory hole formation and subsequent formation of memory cells, real profiles may deviate from this profile, and memory holes may not have perfect cylindrical shapes. A memory hole may have a larger diameter at some locations than others leading to memory cells with different device characteristics. Such differences may be predictable to some extent so that memory operation can compensate accordingly.

Figure 14:
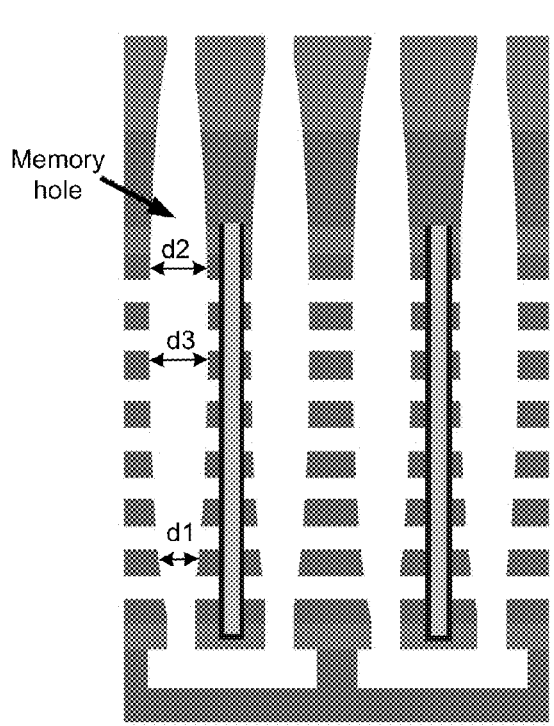
FIG. 14 shows an example of a non-uniform memory hole.

FIG. 14 shows a cross section of memory holes formed by an etch process that provides a narrower memory hole at the bottom (diameter=d1) than at the top (diameter=d2), with the widest memory hole close to the middle of the stack (diameter=d3). In general, such a profile is a characteristic of the process used (i.e. materials being etched, etch chemistry, temperature, pressure, time, etc.). Thus, the profile of a memory hole is generally non-uniform in a predictable way (though not necessarily in the particular way shown in FIG. 14).

In a cylindrical memory cell the smaller the cylinder of the memory hole, the greater the coupling between the control gate (word line) and the CTL. As the diameter of the memory hole gets smaller, the electric field strength between the control gate and channel gets larger for a given voltage difference, so that a given control gate voltage has more effect. This means that programming speed is generally higher for memory cells with smaller memory holes.

Memory hole size is predictable as a function of location within a stack of layers. For example, the lowest memory cells in the stack, nearest to the back gate, have the smallest memory holes in the above example and have a greater risk of overprogramming. Memory cells at the top or at some midpoint may be least at risk of overprogramming. Thus, the susceptibility of memory cells to overprogramming may be predicted based on location (e.g. by word line) and appropriate action can be taken making overprogramming of such cells less likely.

Appropriate action to compensate for variation in a device dimension may include modifying certain operating parameters. In this way, a variation in the physical geometry of memory cells from location-to-location can be offset by making appropriate modifications to parameters used to access different memory cells. For example, different programming parameters may be used to program different word lines in order to avoid overprogramming along particular word lines or to overcome other location-dependent problems. Programming voltage may be modified for certain word lines, and/or programming times may be modified, and/or number of programming pulses used, or other parameters may be modified.

Read parameters may also be modified according to location to compensate for physical device variation. For example, a lower read voltage, Vread, may be used for memory cells having a smaller memory hole. Other read parameters may also be modified.

Erase parameters may also be modified according to location to compensate for physical device variation. In some cases a sub-block erase scheme may use a first set of erase parameters for a sub-block near the bottom of a 3-D memory array and a different set of erase parameters for a sub-block near the middle or top of a 3-D memory array. Specific parameters that may be modified include erase voltage, and erase verify conditions.

While the above examples refer to memory hole size as an example of a device dimension that varies with location in a predictable manner, any dimension that varies in a predictable manner may also cause variation in device characteristics in a predictable pattern, and operating parameters can be modified based on location to compensate for such variation. Such variation in device dimensions are not limited to variation between different levels (along z axis) but may also occur from location-to-location in a level, and thus may occur in planar structures such as planar NAND.

Modifying operating parameters based on location as described above may be combined with other modifications of operating parameters. For example, there may be variation in device characteristics from one die to another within a wafer, or from block to block within a die, and some scheme may compensate for such variation by modifying certain operating parameters. In some cases, factory testing measures some variation and sets certain operating parameters accordingly in a parameter trimming process. In some cases, operating parameters are modified as a memory array, or a portion of a memory array, becomes worn. For example, a count may be maintained of the number of write-erase cycles ("hot count") for blocks of a memory array, with operating parameters being modified to compensate for changes to memory cells as they become worn. The present scheme may be combined with any such scheme, or schemes. For example, a location based scheme may provide one or more offsets, or deltas, to parameters used in a baseline zone. The parameters used in the baseline zone may be based on factory testing, and may be updated according to write-erase cycle count or other updating mechanism.

Figure 15:
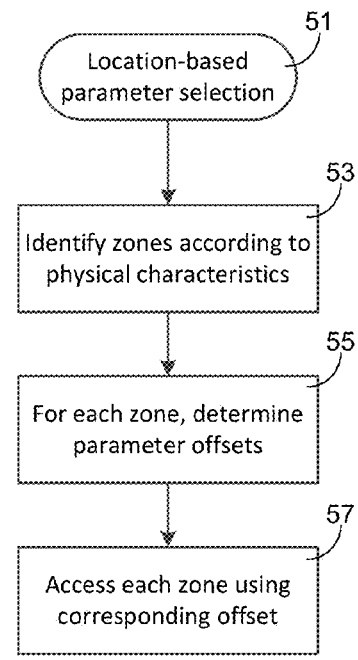
FIG. 15 illustrates an example of location-based parameter selection.

FIG. 15 is a flow chart showing a scheme for location-based parameter selection 51. Initially, zones are identified according to physical characteristics 53. For example, in a 3-D memory array, zones may reflect the diameter of the memory hole at different levels above the substrate. Zones may include only a single layer (two word lines) or may include multiple layers that share similar physical characteristics (e.g. approximately the same memory hole diameter). For each zone a set of parameter offsets are determined 55. In an example, a set of parameters of a baseline zone may provide a starting point for any scheme, with a set of parameters for a given zone defined by a set of offsets from parameters of the baseline zone. Access to each zone is then performed using the corresponding offsets to the default parameters 57.

In some schemes, a set of offsets for a particular zone remain constant throughout the lifecycle of the device. The parameters of the baseline zone may be updated to account for wear and the parameters for all zones are thereby updated because the parameters are set by offsets from the baseline parameters. However, in some cases it is desirable to update the offsets themselves in addition to (or instead of) updating the baseline parameters. For example, memory cells with a smaller memory hole may wear faster because of the higher field strength generated between their control gate and channel. Updating operating parameters on a block-by-block basis does not take into account such faster wearing of certain portions of the block (e.g. word lines towards the bottom). It is sometimes advantageous to use dynamic offsets instead of static offsets in order to keep operating parameters optimized in all zones over the lifecycle of the device.

Figure 16:
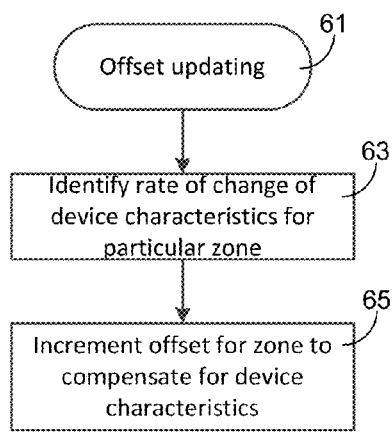
FIG. 16 illustrates updating of offsets for different zones.

FIG. 16 is a flow chart showing a scheme for updating offsets 61. The rate of change of device characteristics is identified for individual zones 63. For example, the baseline zone may have a particular rate of change of programming speed, or erase speed, or other characteristic that may be used to determine how baseline parameters are updated as a function of write-erase cycle count. Another zone may have a different rate of change of a characteristic so that updating of baseline parameters is not sufficient to account for change in the other zone. Accordingly, the offset of that parameter for the zone is incremented 65 (either when incrementing baseline parameters, or separately) to compensate for the different rates of change.

Figure 17:
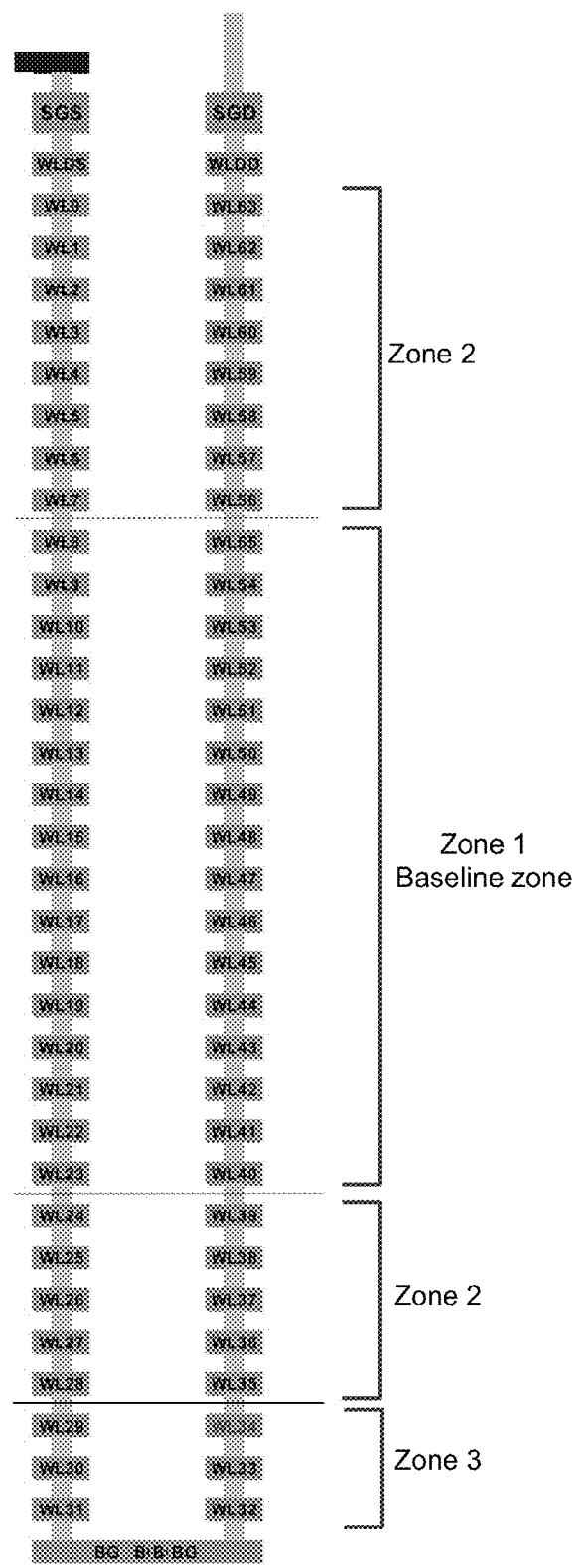
FIG. 17 illustrates an example of zones in a 3-D NAND memory array.

A memory array may be divided into zones in any suitable manner to account for different physical characteristics of memory cells in different locations. In general, it is desirable to keep the number of zones small in order to keep the system simple, and reduce overhead. FIG. 17 shows an example of a zoning scheme for use in a 64 cell/string 3-D NAND array (while just one NAND string is shown, it will be understood that zoning may be similarly applied to all strings in a block, or all strings in a memory array, or some portion of a memory array). Three zones are used in this example. The largest zone is the baseline zone, zone 1, which includes memory cells with substantially uniform memory hole diameter along WL8-WL23 and WL40-WL55. Zone 1 has memory cells with relatively large memory holes. Zone 2 includes memory cells above (along WL0-WL7, WL56-WL63) and below (along WL24-WL28, WL35-WL39) zone 1. Thus, zone 2 is not continuous in this example. Zone 2 includes memory cells with somewhat smaller memory holes than zone 1. Zone 3 includes memory cells near the bottom of the stack (WL29-34), which have the smallest memory holes. Parameters for zone 1 may be baseline parameters. These may be factory-set, and may be updated based on write-erase cycle count. Parameters for zone 2 may be offset according to a first set of offsets. Parameters for zone 3 may be offset according to a second, different, set of offsets. The offsets for zone 3 may be greater than for zone 2.

It will be understood that any suitable zoning scheme may be used including providing a different zone for each level. It will also be understood that aspects of the above examples may be used separately (e.g. zoning does not require updated offsets, or that a particular baseline zone be used). Zones used for parameter modification may be the same for all parameters (read, write, and erase) or may be different for different operations (e.g. one zoning scheme for read parameters, a different zoning scheme for write parameters, and another zoning scheme for erase parameters).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are It is claimed:

1. A method of operating a nonvolatile memory formed in two or more physical levels of memory cells disposed above a substrate comprising:
    determining a first set of parameters to use in accessing a first plurality of memory cells in a first physical level based on at least one memory cell dimension of the first plurality of memory cells;
    determining a second set of parameters to use in accessing a second plurality of memory cells in a second physical level based on the at least one memory cell dimension of the second plurality of memory cells, the second set of parameters including at least one parameter that is different from the first set of parameters;
    subsequently accessing the first plurality of memory cells using the first set of parameters; and
    accessing the second plurality of memory cells using the second set of parameters.

2. The method of claim 1 wherein the at least one memory cell dimension is a diameter of memory holes that extend through the plurality of physical levels of memory cells.

3. The method of claim 2 wherein the first plurality of memory cells are located in a lower physical level of the three-dimensional memory array, the second plurality of memory cells are located in an upper physical level of the three-dimensional memory array, and the diameter of the memory holes is greater in the second plurality of memory cells than in the first plurality of memory cells.

4. The method of claim 1 wherein the at least one parameter that is different is a voltage that is applied to program memory cells.

5. The method of claim 1 wherein the at least one parameter that is different is a number of voltage pulses used to program memory cells.

6. The method of claim 1 wherein the at least one parameter that is different is a read voltage that is used to read memory cells.

7. The method of claim 1 wherein the at least one parameter that is different is an erase voltage that is used to erase memory cells.

8. The method of claim 1 further comprising maintaining a write-erase cycle count for blocks of the nonvolatile memory and updating the first and second sets of parameters according to the write erase cycle counts.

9. The method of claim 8 further comprising updating the first set of parameters according to a first update scheme and updating the second set of parameters according to a second update scheme that is different from the first update scheme.

10. A nonvolatile memory system comprising:
    a nonvolatile memory array formed in two or more physical levels of memory cells disposed above a substrate, each memory cell having a memory cell dimension, the memory cell dimension having a pattern of variation from physical level to physical level; and
    memory access circuits that access memory cells of the array of memory cells according to access parameters, the memory access circuits having a first set of parameters for accessing a first plurality of memory cells of a first physical level and a second set of parameters for accessing a second plurality of memory cells of a second physical level, the second set of parameters including at least one parameter that is different from the first set of parameters.

11. The nonvolatile memory system of claim 10 wherein the nonvolatile memory system is a three-dimensional NAND memory array which includes a plurality of NAND strings that extend vertically in a direction that is perpendicular to a substrate surface to connect memory cells of the two or more physical levels.

12. The nonvolatile memory system of claim 11 wherein the pattern of variation is a pattern of variation of the memory cell dimension according to vertical distance from the substrate surface.

13. The nonvolatile memory system of claim 12 wherein the memory cell dimension is a diameter of an opening that extends vertically through word lines of the two or more physical levels with a channel extending vertically through the opening.

14. The nonvolatile memory system of claim 10 further comprising a write-erase cycle count circuit that maintains write-erase cycle counts for blocks in the nonvolatile memory system and updates access parameters according to write-erase cycle counts, the write-erase cycle count circuit formed on the substrate.

15. The nonvolatile memory system of claim 14 wherein the write-erase cycle count circuit has a first update scheme for updating the first set of parameters and a second update scheme for updating the second set of parameters.

16. The nonvolatile memory system of claim 10 wherein the memory access circuits have one or more additional sets of parameters for accessing additional memory cells of physical levels other than the first and second physical levels.

* * * * *